(12) United States Patent
Lian et al.

(10) Patent No.: US 9,450,111 B2
(45) Date of Patent: Sep. 20, 2016

(54) SCHOTTKY BARRIER DIODE

(71) Applicant: NATIONAL TSING HUA UNIVERSITY, Hsinchu (TW)

(72) Inventors: Yi-Wei Lian, Hsinchu (TW); Shuo-Hung Hsu, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 0 days.

(21) Appl. No.: 14/244,090

(22) Filed: Apr. 3, 2014

(65) Prior Publication Data

US 2015/0171228 A1 Jun. 18, 2015

(30) Foreign Application Priority Data

Dec. 17, 2013 (TW) .............................. 102146525 A

(51) Int. Cl.
H01L 29/872 (2006.01)
H01L 29/417 (2006.01)
H01L 29/08 (2006.01)
H01L 29/06 (2006.01)

(52) U.S. Cl.
CPC .............. *H01L 29/872* (2013.01); *H01L 29/08* (2013.01); *H01L 29/417* (2013.01); *H01L 29/0692* (2013.01)

(58) Field of Classification Search
None
See application file for complete search history.

(56) References Cited

U.S. PATENT DOCUMENTS

| 2003/0060031 | A1* | 3/2003 | Asano et al. | 438/572 |
|---|---|---|---|---|
| 2008/0121895 | A1* | 5/2008 | Sheppard et al. | 257/76 |
| 2010/0140660 | A1* | 6/2010 | Wu et al. | 257/183 |
| 2010/0230774 | A1* | 9/2010 | Alter | 257/474 |
| 2011/0309371 | A1* | 12/2011 | Hsu et al. | 257/76 |

* cited by examiner

*Primary Examiner* — Erik Kielin

(57) ABSTRACT

A Schottky barrier diode includes a substrate, a buffer layer formed on the substrate, an upper layer formed on the buffer layer, a first electrode layer formed on the upper layer as an anode of the Schottky barrier diode, a second electrode layer formed on the upper layer as a cathode of the Schottky barrier diode, and a first n-type doping region formed in the upper layer and under the first electrode layer, and contacting the first electrode layer. An edge of the first n-type doping region and an edge of the first electrode layer are separated by a first predetermined distance at a first direction at which the first electrode layer faces the second electrode layer.

8 Claims, 5 Drawing Sheets

SCHOTTKY BARRIER DIODE

CROSS REFERENCE TO RELATED APPLICATIONS

This Application claims priority of Taiwan Patent Application No. 102146525, filed on Dec. 17, 2013, the entirety of which is incorporated by reference herein.

BACKGROUND OF THE INVENTION

1. Field of the Invention

The present invention relates to a Schottky barrier diode and in particular to a Schottky barrier diode, having a low onset voltage without sacrificing breakdown voltage.

2. Description of the Related Art

Recently, Schottky barrier diodes are commonly applied to switching power supplies. Under the high switching frequency, in order to enhance the efficiency of switching power supplies, there is a need to improve the characteristics of the components adopted by switching power supplies, for example, the conduction loss of Schottky barrier diodes. Therefore, the characteristics of the Schottky barrier diode focus on two parts. The first part is the onset voltage and the second part is the breakdown voltage. In more specific terms, due to the higher onset voltage (such as 1V~1.5 V) of the conventional AlGaN/GaN Schottky barrier diode, the conduction loss is serious. The structure of the Schottky barrier diode has to be improved for resolving the above-mentioned problems.

With regard to the structure of the Schottky barrier diode, generally, the Schottky barrier diode has an anode and a cathode. The junction formed between the metal arranged to be the anode of the Schottky barrier diode and the barrier layer of the Schottky barrier diode is the Schottky contact. The junction formed between the metal arranged to be the cathode and the barrier layer of the Schottky barrier diode is the ohmic contact. Gallium nitride (GaN) devices are commonly applied to fabricate conventional Schottky barrier diodes, and however there are some drawbacks in the GaN devices. For example, metal spiking can occur around the region of the ohmic contact, such that a high electric field is produced in the local regions, further resulting in the early breakdown of the GaN Schottky barrier diode. Moreover, the fabrication of the ohmic resistance is relatively difficult and therefore it is more difficult to yield good ohmic characteristics because the GaN material is a wide bandgap semiconductor. Finally, for the same reasons (i.e. GaN material being the wide bandgap semiconductor), the onset voltage of the GaN device is usually higher (about 1 V~2 V), such that the whole efficiency of the electronic system becomes worse.

In view of this, there is a need to present a new Schottky barrier diode for resolving the problems in which the conventional Schottky barrier diode reduces the onset voltage, but sacrificing the breakdown voltage.

BRIEF SUMMARY OF THE INVENTION

In order to resolve the problems of the conventional Schottky barrier diode, the present invention presents a Schottky barrier diode comprising a substrate. The Schottky barrier diode further comprises a buffer layer, formed on the substrate. The Schottky barrier diode further comprises an upper layer, formed on the buffer layer. The Schottky barrier diode further comprises a first electrode layer, formed on the upper layer, as an anode of the Schottky barrier diode. The Schottky barrier diode further comprises a second electrode layer, formed on the upper layer, as a cathode of the Schottky barrier diode. The Schottky barrier diode further comprises a first n-type doping region, formed in the upper layer and under the first electrode layer, and contacting the first electrode layer, wherein an edge of the first n-type doping region and an edge of the first electrode layer are separated by a first predetermined distance in a first direction at which the first electrode layer faces the second electrode layer.

The aforementioned Schottky barrier diode presented by the present invention has a low onset voltage without sacrificing breakdown voltage.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
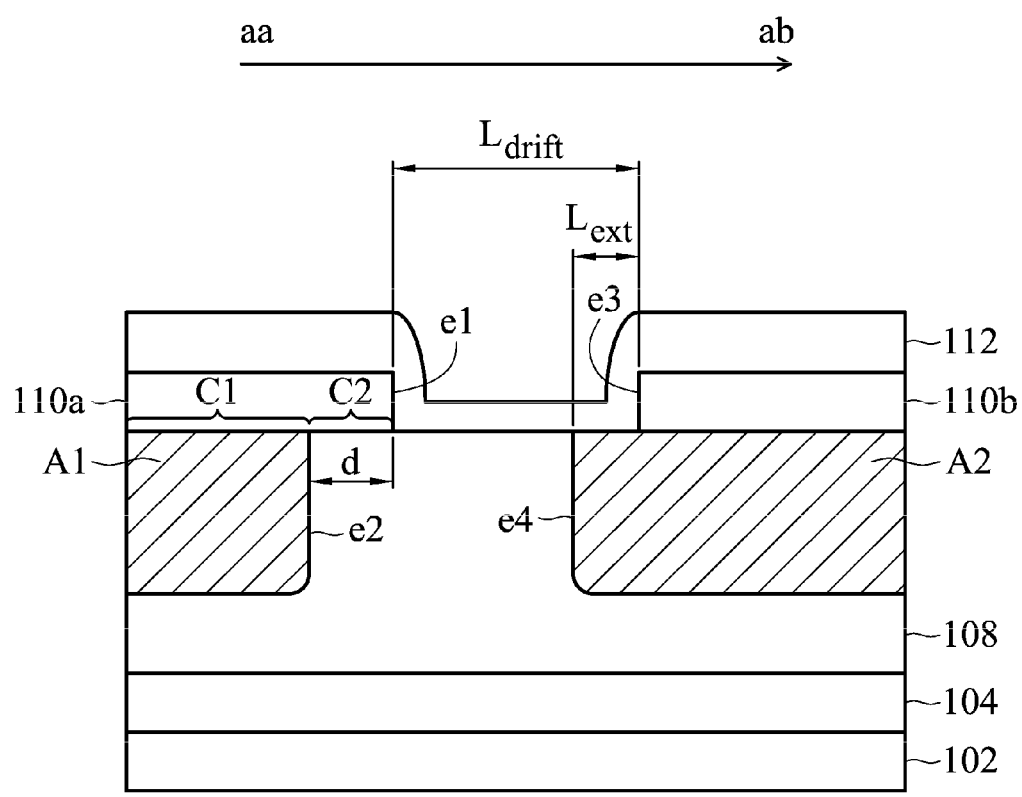
FIG. 1 is a diagram illustrating the structure of a Schottky barrier diode, according to an embodiment of the present invention.

FIG. 1 is a diagram illustrating the structure of a Schottky barrier diode, according to an embodiment of the present invention. A Schottky barrier diode 10 comprises a substrate 102, a buffer layer 104, an upper layer 108, a first electrode layer 110a, a second electrode layer 110b, a passivation layer 112, a first n-type doping region A1 and a second n-type doping region A2.

Referring to FIG. 1, the buffer layer 104 is formed on the substrate 102, and the upper layer 108 is formed on the buffer layer 104. The first electrode layer 110a is formed on the upper layer 108 as the anode of the Schottky barrier diode 10, wherein the first electrode layer 110a may be made of High-Work-Function metal, such as Ni, Pt, Pd, or a metal which can form the Schottky contact with the upper layer 108. The second electrode layer 110b is formed on the upper layer 108 as the cathode of the Schottky barrier diode 10, wherein the second electrode layer 110b may be made of Low-Work-Function metal, such as the alloy structure combined with Ti, Al, Ni, Au, etc . . . , or a metal which can form the ohmic contact with the upper layer 108. An edge e1 of the first electrode layer 110a and an edge e3 of the second electrode layer 110b are separated by a third predetermined distance $L_{drift}$ at the first direction aa-ab (i.e. in FIG. 1, the direction at which aa points to ab).

The feature of the present invention is that the selective n-type doping is applied to anode and cathode of the Schottky barrier diode. In this way, the onset voltage of the Schottky barrier diode is reduced without sacrificing the breakdown voltage of the Schottky barrier diode. The Anode and the cathode structure of the Schottky barrier diode will be described in detail below.

The Anode of the Schottky Barrier Diode

The first n-type doping region A1 is formed in the upper layer 108 and under the first electrode layer 110a, and contacts the first electrode layer 110a. An edge e2 of the first n-type doping region A1 and the edge e1 of the first electrode layer 110a are separated by a first predetermined distance d in the first direction aa-ab at which the first electrode layer 110a faces the second electrode layer 110b.

Compared with the conventional Schottky barrier diode, the Schottky barrier diode 10 of the present invention further discloses that the selective n-type doping is performed under the first electrode layer 110a to form the first n-type doping region A1 in the upper layer 108 and under the first electrode layer 110a. In a specific embodiment of the present invention, referring to FIG. 1, in more specific terms, the first n-type doping region A1 is formed by, for example, doping silicon ion into the upper layer 108 through ion implementation or diffusion. It is worthy of noting that, as shown in FIG. 1, only part of the first electrode layer 110a contacts the upper layer 108 doped by, for example, silicon ion, and the junction is C1. The rest of the first electrode layer 110a does not contact the doped upper layer 108, and the junction is C2. The Schottky barrier of the junction C1 is lower, resulting in a lower onset voltage. The Schottky barrier of the junction C2 is higher, resulting in a higher onset voltage. In short, compared with the conventional Schottky barrier diode having a junction with only one Schottky barrier, the Schottky barrier diode 10 of the present invention has a low onset voltage without sacrificing too much breakdown voltage (lower than 10%) due to the behavior of the first n-type doping region A1 because there are two junctions C1 and C2 with different Schottky barriers between the first electrode layer 110a and the upper layer 108.

The cathode of the Schottky Barrier Diode

In the process of fabricating the cathode metal of the Schottky barrier diode, high-temperature annealing is required to form the alloy ohmic contact. However, the above process will lead to the metal spiking around the region of the ohmic contact, such that a high electric field is produced around the edge of the cathode metal. Therefore, the breakdown voltage of the Schottky barrier diode is reduced.

In view of this, referring to FIG. 1 of an embodiment of the present invention, the Schottky barrier diode further comprises a second n-type doping region A2. The second n-type doping region A2 is formed in the upper layer 108 and beneath the second electrode layer 110b, and contacts the second electrode layer 110b. An edge e4 of the second n-type doping region A2 is further extended from the edge e3 of the second electrode layer 110b toward the first electrode layer 110a for a second predetermined distance $L_{ext}$ (i.e. the edge e3 and the edge e4 are separated by the second predetermined distance $L_{ext}$), the direction of the extension is parallel to the first direction aa-ab, and the second n-type doping region A2 does not contact the first electrode layer 110a. In other words, the second n-type doping region A2 does not extend to a region under the first electrode layer 110a.

Compared with the conventional Schottky barrier diode, the Schottky barrier diode 10 of the present invention further discloses that the selective n-type doping is performed beneath the second electrode layer 110b to form the second n-type doping region A2 in the upper layer 108 and beneath the first electrode layer 110a. In a specific embodiment of the present invention, referring to FIG. 1, in more specific terms, the second n-type doping region A2 is formed by, for example, doping silicon ion into the upper layer 108 with ion implement or diffusion. The electric field around the region of the ohmic contact is re-distributed by extending the second predetermined distance $L_{ext}$, and therefore the breakdown voltage of the Schottky barrier diode is raised. Moreover, the ohmic barrier of the junction between the upper layer 108 and the second electrode layer 110b is reduced.

Figure 2:
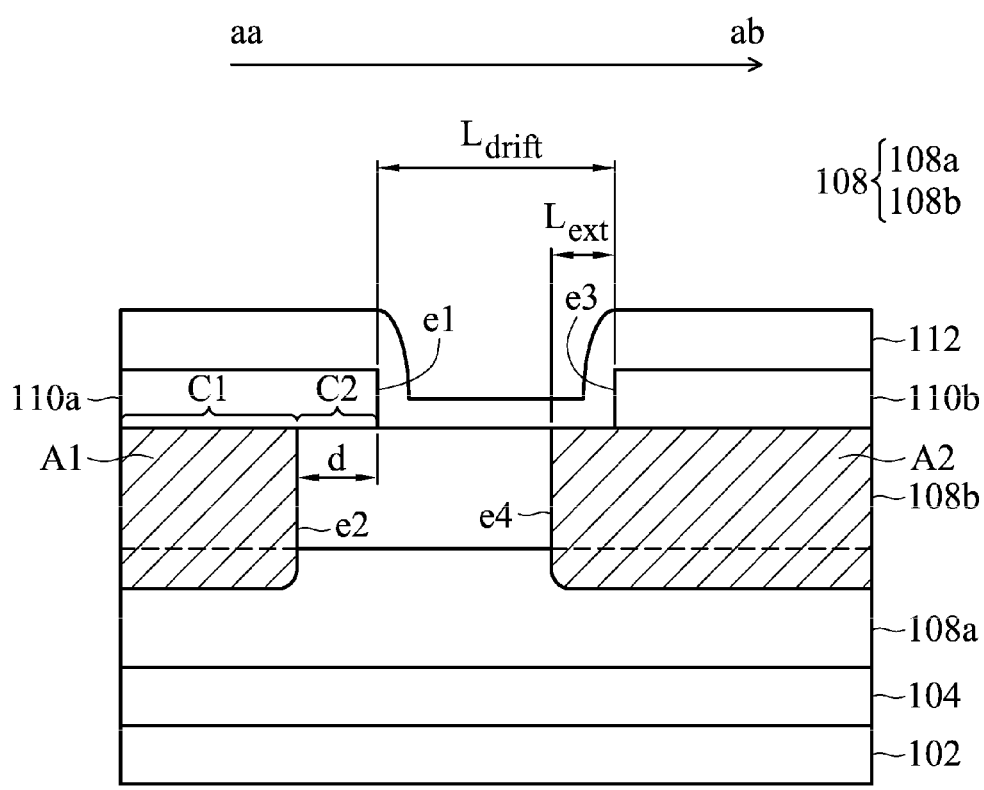
FIG. 2 is a diagram illustrating the structure of a Schottky barrier diode, according to an embodiment of the present invention.

FIG. 2 is a diagram illustrating the structure of a Schottky barrier diode, according to an embodiment of the present invention. FIG. 2 is substantially the same as FIG. 1, and the difference is that the upper layer 108 further comprises a channel layer 108a and a barrier layer 108b. The channel layer 108a is formed on the buffer layer 104, the barrier layer 108b is formed on the channel layer 108a, the first n-type doping region A1 is formed in the barrier layer 108b and under the first electrode layer 110a. A second n-type doping region A2 is formed in the barrier layer 108b and beneath the second electrode layer 110b. The first n-type doping region A2 and the second n-type doping region A2 may be extended to the channel layer 108a (as shown in FIG. 2), but it is not limited thereto. In a specific embodiment, the channel layer 108a is made of a metal nitride layer, and the metal of the metal nitride layer comprises Ga, In, Al, or any combination thereof (for example, the combination may be GaN or InGaN). In a specific embodiment, the barrier layer 108 is a metal nitride layer, and the metal of the metal nitride layer comprises Ga, In, Al, or the any combination thereof (for example, the combination may be AlGaN, AIN, or AlInN). In a specific embodiment, the buffer layer 104 is metal nitride layer, and the metal of the metal nitride layer comprises Ga, Al, or any combination thereof (for example, the combination may be AlGaN or AIN). In a specific embodiment, the material of the substrate 102 is the one of SiC, sapphire, diamond, and Si substrate. In a specific embodiment, the substrate 102 is silicon substrate, the material of the channel layer 108aa is GaN, and the barrier layer 108b further comprises a first layer and a second layer. The first layer is formed on the channel layer 108a, the second layer is formed on the first layer, and the first electrode layer 110a and the second electrode layer 110b are formed on the second layer, wherein the material of the first layer is AlGaN and the material of the second layer is GaN cap.

The features of the Schottky barrier diode of FIG. 2 are similar with the Schottky barrier diode of FIG. 1 because the structures are similar between FIG. 2 and FIG. 1. In short, there are two junctions C1 and C2 with the different Schottky barrier between the first electrode layer 110a and the barrier layer 108b, and therefore the Schottky barrier diode 10 of the present invention has a low onset voltage without sacrificing too much breakdown voltage (lower than 10%). In other words, the electric field around the region of the ohmic contact is re-distributed by extending the second predetermined distance $L_{ext}$ and therefore the breakdown voltage is raised. Moreover, the ohmic barrier of the junction between the upper layer 108 and the second electrode layer 110b is reduced.

Figure 3:
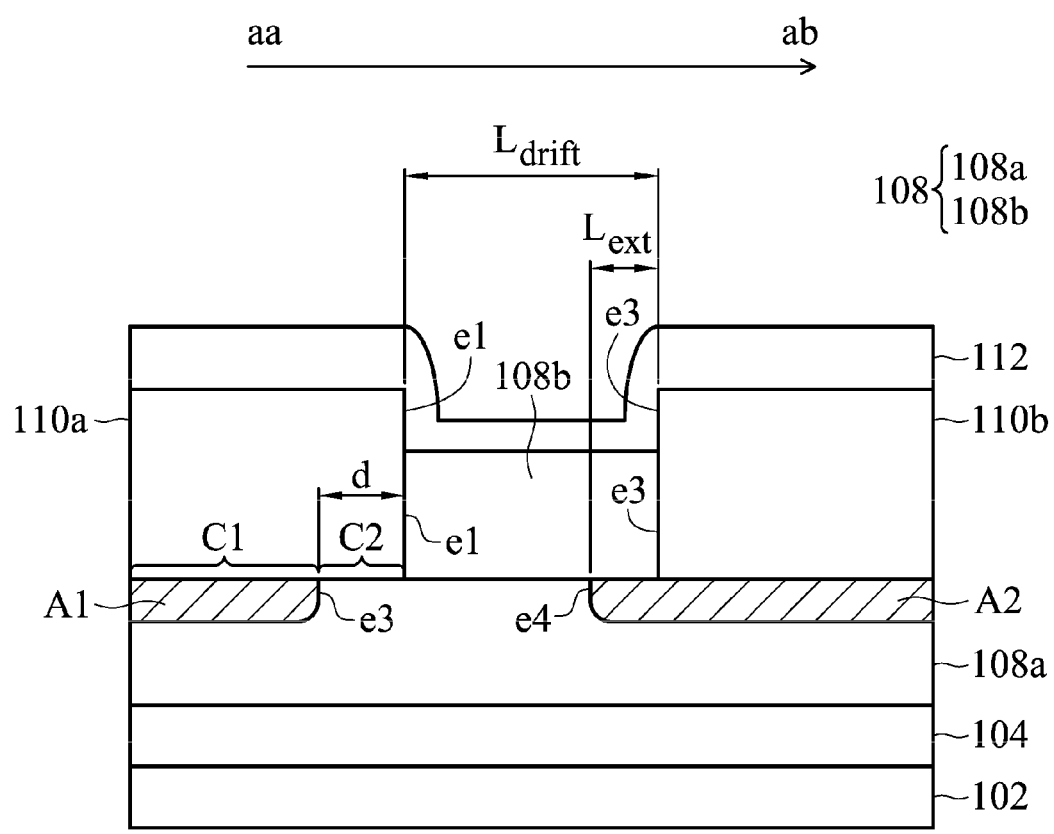
FIG. 3 is a diagram illustrating the structure of a Schottky barrier diode, according to another embodiment of the present invention.

FIG. 3 is a diagram illustrating the structure of a Schottky barrier diode, according to another embodiment of the present invention. The difference between FIG. 3 and FIG.

2 is that the first electrode layer 110a, the second electrode layer 110b and the barrier layer 108b are formed on the channel layer 108a, the barrier layer 108b is formed between the first electrode layer 110a and the second electrode layer 110b, the first n-type doping region A1 is formed in the channel layer 108a and under the first electrode layer 110a. The second n-type doping region A2 is formed in the channel layer 108a and beneath the second electrode layer 110b. In more specific terms, referring to FIG. 2, before fabricating the first electrode layer 110a and the second electrode layer 110b, the barrier layer 108b beneath two electrode layers is further etched, such that two electrode layers are directly formed on the channel layer 108a. The features of the Schottky barrier diode of FIG. 3 are similar with the Schottky barrier diode of FIG. 2 because the structures are similar between FIG. 3 and FIG. 2. In short, there are two junctions C1 and C2 with the different Schottky barrier between the first electrode layer 110a and the barrier layer 108b, and therefore the Schottky barrier diode 10 of the present invention has a low onset voltage without sacrificing too much breakdown voltage Likewise, the electric field around the region of the ohmic contact is re-distributed by extending the second predetermined distance $L_{ext}$, and therefore the breakdown voltage is raised. Moreover, the ohmic barrier of the junction between the upper layer 108 and the second electrode layer 110b is reduced.

Figure 4A:
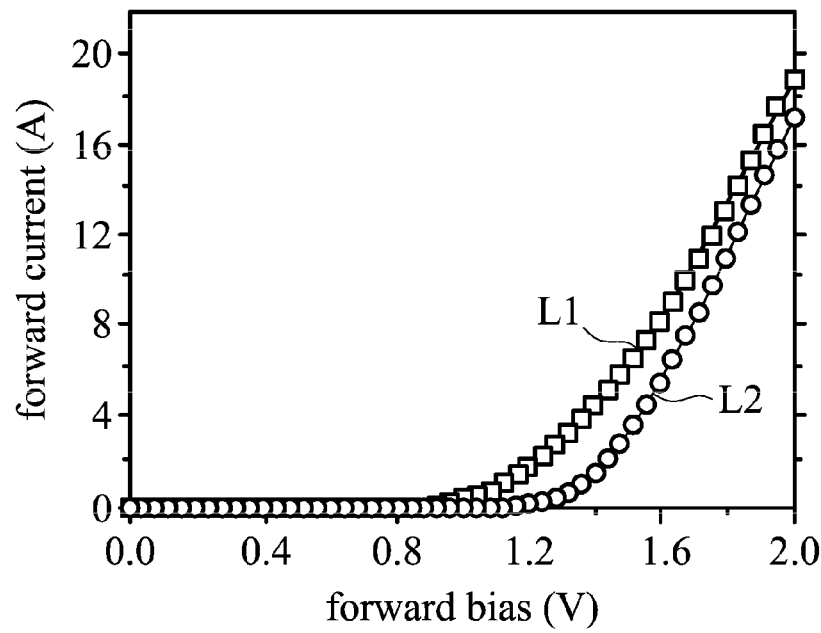
FIGS. 4A-4B are characteristic diagrams illustrating forward current-voltage of the Schottky barrier diode, according to an embodiment of the present invention.
Figure 4B:
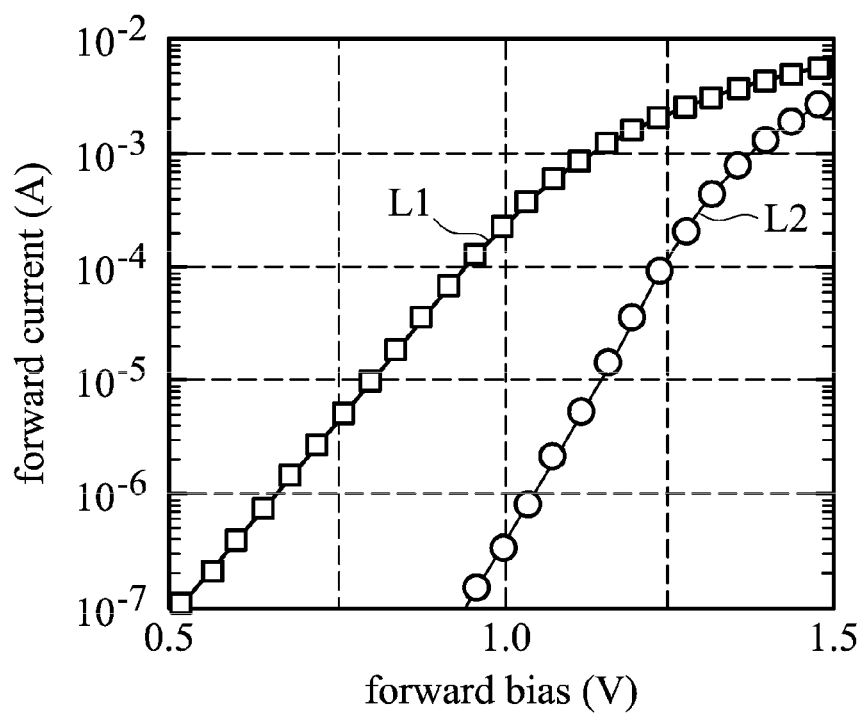

FIGS. 4A-4B are characteristic diagrams illustrating forward current-voltage of the Schottky barrier diode, according to an embodiment of the present invention. The curve L1 shows current-voltage of the Schottky barrier diode 10 of the present invention. The curve L2 shows current-voltage of the conventional Schottky barrier diode. The conventional Schottky barrier diode has a junction with only one Schottky barrier and therefore the onset voltage of the conventional Schottky barrier diode is higher, as per the curve L2 in FIG. 4A. The onset voltage of the conventional Schottky barrier diode is about 1.3 V. Conversely, in FIG. 2, the junctions C1 and C2 with two Schottky barriers are disposed between the first electrode layer 110a and the barrier layer 108b of the present invention, and therefore the onset voltage of the Schottky barrier diode 10 of the present invention is lower, as per the curve L1 in FIG. 4A. The onset voltage of the Schottky barrier diode 10 of the present invention is about 1.0 V. For distinguishing the onset voltages between the Schottky barrier diode 10 and the conventional Schottky barrier diode, FIG. 4B is a diagram of the part of the curve of current-voltage, after taking the log of the forward current of FIG. 4A. Obviously, compared with the conventional Schottky barrier diode, the onset voltage of the Schottky barrier diode 10 of the present invention is lower.

Figure 5:
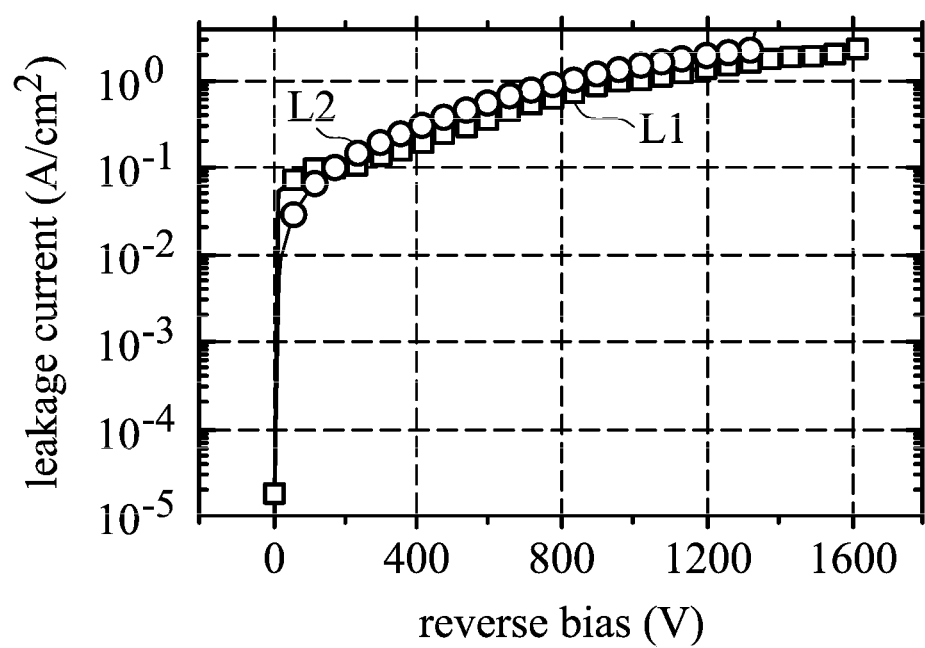
FIG. 5 is characteristic diagram illustrating reverse bias-leakage current of the Schottky barrier diode, according to an embodiment of the present invention.

FIG. 5 is characteristic diagram illustrating reverse bias-leakage current of the Schottky barrier diode, according to an embodiment of the present invention. The curve L1 illustrates reverse bias-leakage current of the Schottky barrier diode 10 of the present invention. The curve L2 illustrates reverse bias-leakage current of the conventional Schottky barrier diode. As shown in the figure, two curves are substantially equal to each other, and that means both breakdown voltages are substantially equal to each other. In some specific embodiments, the breakdown voltage of the Schottky barrier diode 10 achieves 1500 V higher than 1250 V of the breakdown voltage of the conventional Schottky barrier diode.

In a preferred embodiment of the present invention, the selective n-type doping is performed under the first electrode layer 110a and in the upper layer 108, such that the onset voltage of the Schottky barrier diode 10 is reduced. The selective n-type doping is performed under the second electrode layer 110b and in the upper layer 108, such that the breakdown voltage of the Schottky barrier diode 10 is raised. Therefore the Schottky barrier diode 10 of the present invention has a low onset voltage without sacrificing breakdown voltage.

The aforementioned technique (applying the selective n-type doping to the place under anode and cathode) can be widely applied to the Schottky barrier diode of group-iii nitride. Moreover, the Schottky barrier diode can be applied to power electronics, switching power supplies and the power amplifier of the high-frequency circuit.

The above paragraphs describe many aspects of the invention. Obviously, the teaching of the invention can be accomplished by many methods, and any specific configurations or functions in the disclosed embodiments only present a representative condition. Those who are skilled in this technology can understand that all of the disclosed aspects in the invention can be applied independently or be incorporated.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A Schottky barrier diode, comprising
a substrate;
a buffer layer, formed on the substrate;
an upper layer, formed on the buffer layer;
a first electrode layer, formed on the upper layer as an anode of the Schottky barrier diode;
a second electrode layer, formed on the upper layer as a cathode of the Schottky barrier diode;
a first n-type doping region, formed in the upper layer and under the first electrode layer, wherein an entire upper surface of the first n-type doping region is in contact with the first electrode layer; and
a second n-type doping region formed in the upper layer and under the second electrode layer, and contacting the second electrode layer;
wherein a lateral edge of the first n-type doping region and a lateral edge of the first electrode layer are separated by a first predetermined distance at a first direction at which the first electrode layer faces the second electrode layer;
wherein a lateral edge of the second n-type doping region is extended from a lateral edge of the second electrode layer in a direction toward the first electrode layer by a second predetermined distance so as to leave a portion of an upper surface of the second n-type doping region uncovered by the second electrode layer, the direction of the extension is parallel to the first direction, and the second n-type doping region does not contact the first electrode layer; and
wherein the upper layer comprises a barrier layer and a channel layer, the channel layer is formed on the buffer layer, the barrier layer is formed on the channel layer;
wherein the barrier layer and the channel layer are metal nitride, and the metal of the metal nitride comprises Ga, In, Al, or a combination thereof; and
wherein the first and the second n-type doping regions are formed entirely within the channel and barrier layers.

2. The Schottky barrier diode as claimed in claim 1, wherein the first and the second n-type doping regions extend into the channel layer, and lowermost surfaces of the first and the second n-type doping regions are completely interior to and in direct contact with material of the channel layer.

3. The Schottky barrier diode as claimed in claim 1, wherein the first electrode layer and the second electrode layer are formed on the barrier layer, and the first n-type doping region is formed in the barrier layer and under the first electrode layer.

4. The Schottky barrier diode as claimed in claim 1, wherein the first electrode layer, the second electrode layer and the barrier layer are formed on the channel layer and the barrier layer is formed between the first electrode layer and the second electrode layer, and the first n-type doping region is formed in the channel layer and under the first electrode layer.

5. The Schottky barrier diode as claimed in claim 3, wherein the second n-type doping region is formed in the barrier layer and under the second electrode layer, and contacting the second electrode layer.

6. The Schottky barrier diode as claimed in claim 4, wherein the second n-type doping region is formed in the channel layer and beneath the second electrode layer, and contacting the second electrode layer.

7. The Schottky barrier diode as claimed in claim 1, wherein the edge of the first electrode layer and the edge of the second electrode layer are separated by a third predetermined distance in the first direction.

8. The Schottky barrier diode as claimed in claim 3, wherein the first n-type doping region is extended downward to the channel layer.

* * * * *